(12) United States Patent
Kellogg et al.

(10) Patent No.: US 8,826,855 B2
(45) Date of Patent: Sep. 9, 2014

(54) C-SHAPED CONFINEMENT RING FOR A PLASMA PROCESSING CHAMBER

(75) Inventors: Michael C. Kellogg, Oakland, CA (US); Alexei Marakhtanov, Albany, CA (US); Rajinder Dhindsa, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 436 days.

(21) Appl. No.: 12/828,065

(22) Filed: Jun. 30, 2010

(65) Prior Publication Data

US 2012/0000608 A1     Jan. 5, 2012

(51) Int. Cl.
| | | |
|---|---|---|
| C23C 16/00 | (2006.01) | |
| C23F 1/00 | (2006.01) | |
| H01L 21/306 | (2006.01) | |
| H01J 37/32 | (2006.01) | |

(52) U.S. Cl.
CPC ..... *H01J 37/32642* (2013.01); *H01J 37/32623* (2013.01); *H01J 37/32091* (2013.01)
USPC .................................. 118/723 E; 156/345.43

(58) Field of Classification Search
CPC ....................... H01J 37/32623; H01J 37/32633
USPC ............. 156/345.43, 345.44, 345.45, 345.46, 156/345.47; 118/715, 722, 723 R, 723 E; 315/111.21
See application file for complete search history.

(56) References Cited

U.S. PATENT DOCUMENTS

| | | |
|---|---|---|
| 4,340,462 A | 7/1982 | Koch |
| 4,948,458 A | 8/1990 | Ogle |
| 5,200,232 A | 4/1993 | Tappan et al. |
| 5,796,066 A | 8/1998 | Guyot |
| 5,820,723 A | 10/1998 | Benjamin et al. |
| 5,824,605 A | 10/1998 | Chen et al. |
| 5,885,423 A | 3/1999 | Guyot |
| 5,948,704 A | 9/1999 | Benjamin et al. |
| 6,013,155 A | 1/2000 | McMillin et al. |
| 6,090,304 A | 7/2000 | Zhu et al. |
| 6,140,612 A | 10/2000 | Husain et al. |
| 6,170,429 B1 * | 1/2001 | Schoepp et al. ........... 118/723 R |
| 6,178,919 B1 | 1/2001 | Li et al. |
| 6,230,651 B1 | 5/2001 | Ni et al. |
| 6,333,272 B1 | 12/2001 | McMillin et al. |
| 6,506,685 B2 | 1/2003 | Li et al. |
| 6,730,174 B2 * | 5/2004 | Liu et al. ........................ 118/715 |
| 6,824,627 B2 | 11/2004 | Dhindsa et al. |
| 6,847,014 B1 | 1/2005 | Benjamin et al. |
| 6,974,523 B2 | 12/2005 | Benzing et al. |
| 7,161,121 B1 | 1/2007 | Steger |
| 7,776,178 B2 * | 8/2010 | Keller ...................... 156/345.34 |
| 2004/0206309 A1 * | 10/2004 | Bera et al. ..................... 118/728 |
| 2007/0113786 A1 * | 5/2007 | Ho .............................. 118/723 E |
| 2008/0149596 A1 | 6/2008 | Dhindsa et al. |

OTHER PUBLICATIONS

Commonly-owned U.S. Appl. No. 61/238,656, filed Aug. 31, 2009.
Commonly-owned U.S. Appl. No. 61/238,665, filed Aug. 31, 2009.
Commonly-owned U.S. Appl. No. 61/238,670, filed Aug. 31, 2009.

* cited by examiner

*Primary Examiner* — Maureen Gramaglia
(74) *Attorney, Agent, or Firm* — Buchanan Ingersoll & Rooney PC (57) ABSTRACT

Described herein is a confinement ring useful as a component of a capacitively-coupled plasma processing chamber. Inner surfaces of the confinement ring provide an extended plasma confinement zone surrounding a gap between an upper electrode and a lower electrode on which a semiconductor substrate is supported during plasma processing in the chamber.

15 Claims, 7 Drawing Sheets

C-SHAPED CONFINEMENT RING FOR A PLASMA PROCESSING CHAMBER

BACKGROUND

With each successive semiconductor technology generation, wafer diameters tend to increase and transistor sizes decrease, resulting in the need for an ever higher degree of accuracy and repeatability in substrate processing. Semiconductor substrate materials, such as silicon wafers, are routinely processed using plasma processing chambers. Plasma processing techniques include sputter deposition, plasma-enhanced chemical vapor deposition (PECVD), resist strip, and plasma etch. Plasma can be generated by subjecting suitable process gases in a plasma processing chamber to radio frequency (RF) power. Flow of RF current in the plasma processing chamber can affect the processing.

A plasma processing chamber can rely on a variety of mechanisms to generate plasma, such as inductive coupling (transformer coupling), helicon, electron cyclotron resonance, capacitive coupling (parallel plate). For instance, high density plasma can be produced in a transformer coupled plasma (TCP™) processing chamber, or in an electron cyclotron resonance (ECR) processing chamber. Transformer coupled plasma processing chambers, wherein RF energy is inductively coupled into the chambers, are available from Lam Research Corporation, Fremont, Calif. An example of a high-flow plasma processing chamber that can provide high density plasma is disclosed in commonly-owned U.S. Pat. No. 5,948,704, the disclosure of which is hereby incorporated by reference. Parallel plate plasma processing chambers, electron-cyclotron resonance (ECR) plasma processing chambers, and transformer coupled plasma (TCP™) processing chambers are disclosed in commonly-owned U.S. Pat. Nos. 4,340,462; 4,948,458; 5,200,232 and 5,820,723, the disclosures of which are hereby incorporated by reference.

By way of example, plasma can be produced in a parallel plate processing chamber such as the dual frequency plasma etching chamber described in commonly-owned U.S. Pat. No. 6,090,304, the disclosure of which is hereby incorporated by reference. A preferred parallel plate plasma processing chamber is a dual frequency capacitively coupled plasma processing chamber including an upper showerhead electrode and a substrate support. For purposes of illustration, embodiments herein are described with reference to a parallel plate type plasma processing chamber.

Figure 1:
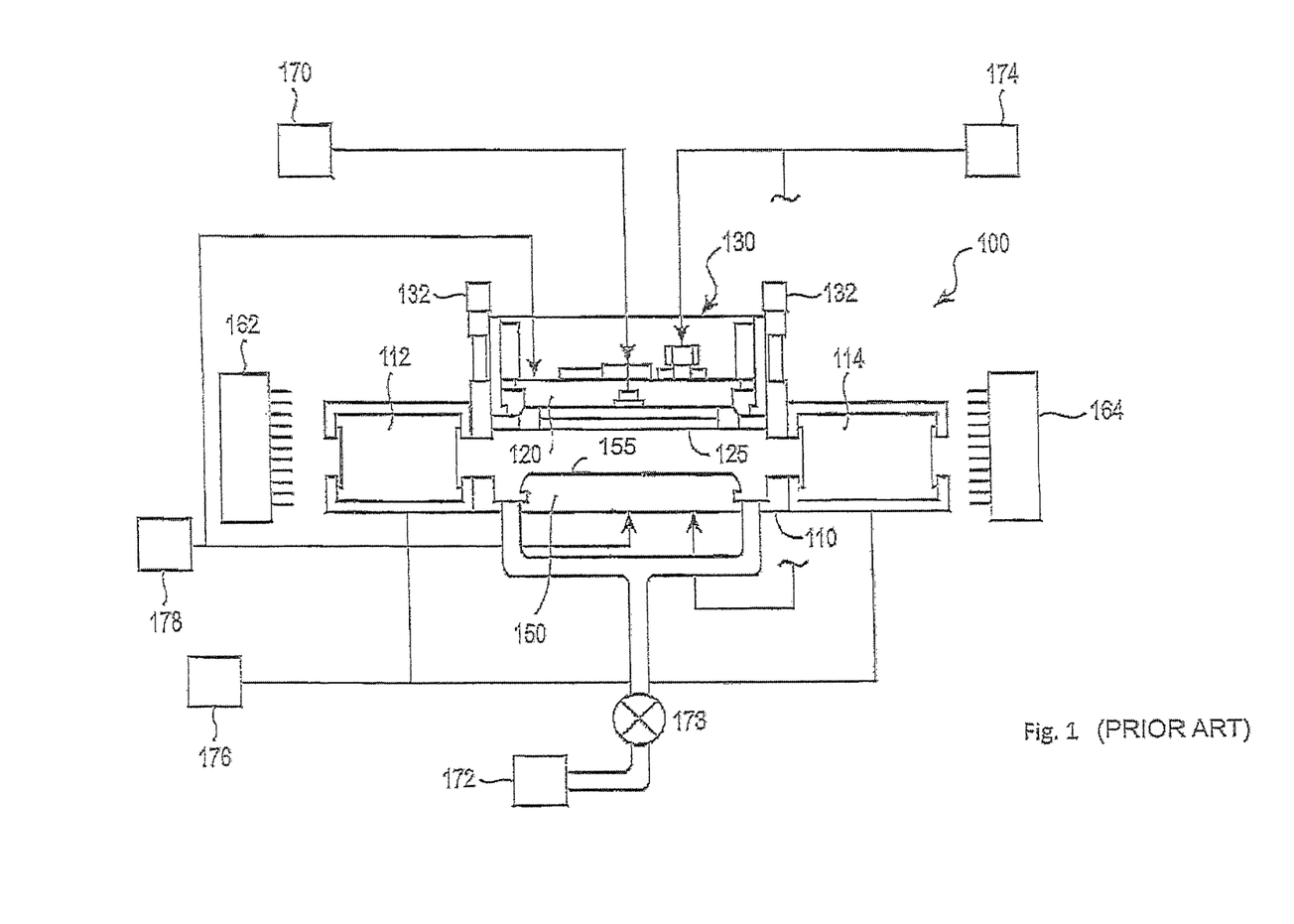
FIG. 1 shows a schematic of an exemplary plasma processing chamber.

A parallel plate plasma processing chamber for plasma etching is illustrated in FIG. 1. The plasma processing chamber 100 comprises a chamber 110, an inlet load lock 112, and an optional outlet load lock 114, further details of which are described in commonly-owned U.S. Pat. No. 6,824,627, which is hereby incorporated by reference in its entirety.

The load locks 112 and 114 (if provided) include transfer devices to transfer substrates such as wafers from a wafer supply 162, through the chamber 110, and out to a wafer receptacle 164. A load lock pump 176 can provide a desired vacuum pressure in the load locks 112 and 114.

A vacuum pump 172 such as a turbo pump is adapted to maintain a desired pressure in the chamber 110. During plasma etching, the chamber pressure is controlled, and preferably maintained at a level sufficient to sustain a plasma. Too high a chamber pressure can disadvantageously contribute to etch stop while too low a chamber pressure can lead to plasma extinguishment. In a medium density plasma processing chamber, such as a parallel plate plasma processing chamber, preferably the chamber pressure is maintained at a pressure below about 200 mTorr (e.g., less than 100 mTorr such as 20 to 50 mTorr) ("about" as used herein means ±10%).

The vacuum pump 172 can be connected to an outlet in a wall of the chamber 110 and can be throttled by a valve 173 in order to control the pressure in the chamber. Preferably, the vacuum pump is capable of maintaining a pressure within the chamber 110 of less than 200 mTorr while etching gases are flowed into the chamber 110.

The chamber 110 includes an upper electrode assembly 120 including an upper electrode 125 (e.g., showerhead electrode), and a substrate support 150. The upper electrode assembly 120 is mounted in an upper housing 130. The upper housing 130 can be moved vertically by a mechanism 132 to adjust the gap between the upper electrode 125 and the substrate support 150.

A process gas source 170 can be connected to the housing 130 to deliver process gas comprising one or more gases to the upper electrode assembly 120. In a preferred plasma processing chamber, the upper electrode assembly comprises a gas distribution system, which can be used to deliver process gas to a region proximate to the surface of a substrate. Gas distribution systems, which can comprise one or more gas rings, injectors and/or showerheads (e.g., showerhead electrodes), are disclosed in commonly-owned U.S. Pat. Nos. 6,333,272; 6,230,651; 6,013,155 and 5,824,605, the disclosures of which are hereby incorporated by reference.

The upper electrode 125 preferably comprises a showerhead electrode, which includes gas holes (not shown) to distribute process gas therethrough. The gas holes can have a diameter of 0.02 to 0.2 inch. The showerhead electrode can comprise one or more vertically spaced-apart baffle plates that can promote the desired distribution of process gas. The upper electrode and the substrate support may be formed of any suitable material such as graphite, silicon, silicon carbide, aluminum (e.g., anodized aluminum), or combinations thereof. A heat transfer liquid source 174 can be connected to the upper electrode assembly 120 and another heat transfer liquid source can be connected to the substrate support 150.

The substrate support 150 can have one or more embedded clamping electrodes for electrostatically clamping a substrate on an upper surface 155 (support surface) of the substrate support 150. The substrate support 150 can be powered by an RF source and attendant circuitry (not shown) such as RF matching circuitry. The substrate support 150 is preferably temperature controlled and may optionally include a heating arrangement (not shown). Examples of heating arrangements are disclosed in commonly assigned U.S. Pat. Nos. 6,847,014 and 7,161,121, which are hereby incorporated by reference. The substrate support 150 can support a semiconductor substrate such as a flat panel or 200 mm or 300 mm wafer on the support surface 155.

The substrate support 150 preferably includes passages therein for supplying a heat transfer gas such as helium under the substrate supported on the support surface 155 to control the substrate temperature during plasma processing thereof. For example, helium back cooling can maintain wafer temperature low enough to prevent burning of photoresist on the substrate. A method of controlling a temperature of a substrate by introducing a pressurized gas into a space between the substrate and the substrate support surface is disclosed in commonly-owned U.S. Pat. No. 6,140,612, the disclosure of which is hereby incorporated by reference.

The substrate support 150 can include lift pin holes (not shown), through which lift pins can be actuated vertically by suitable mechanisms and raise the substrate off the support surface 155 for transport into and out from the chamber 110. The lift pin holes can have a diameter of about 0.08 inch.

Details of lift pin holes are disclosed in commonly owned U.S. Pat. Nos. 5,885,423 and 5,796,066, the disclosures of which is hereby incorporated by reference.

Figure 2:
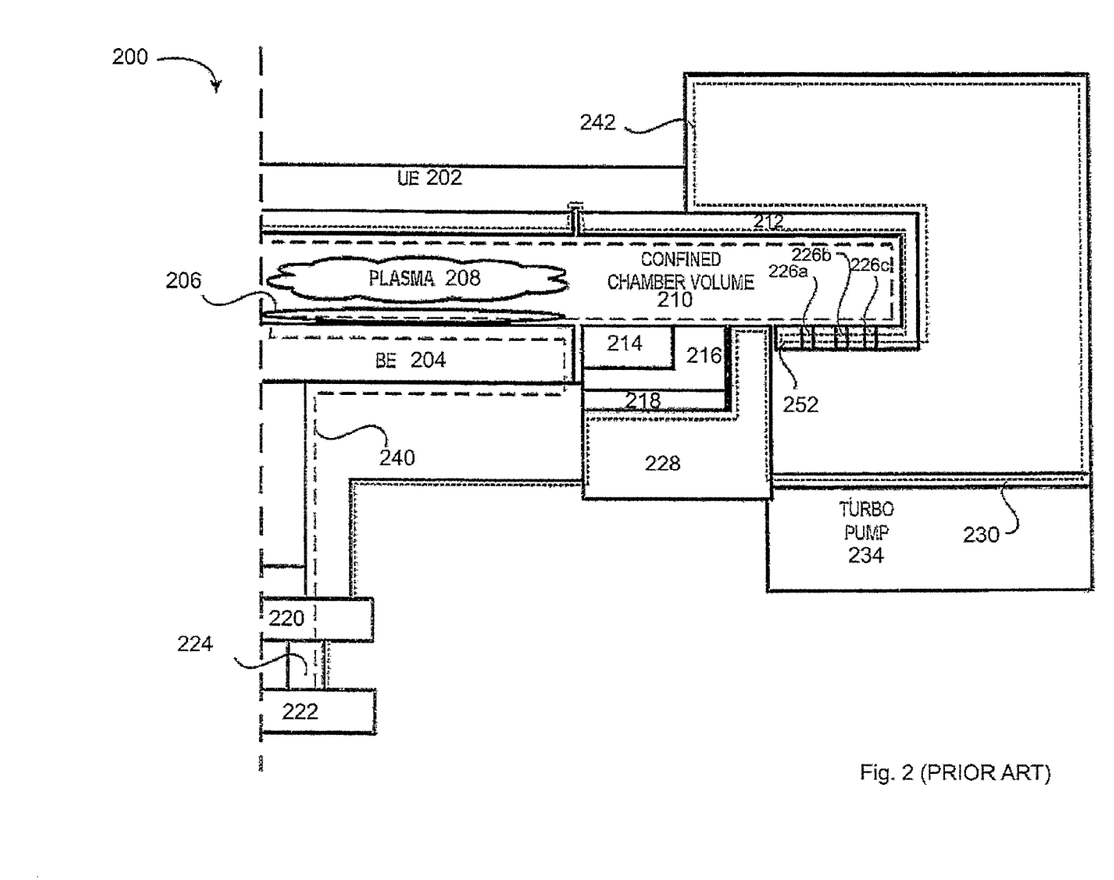
FIG. 2 shows a block diagram of a capacitively coupled plasma processing chamber and an RF return path therein.

FIG. 2 shows a block diagram of a capacitively coupled plasma processing chamber 200 to illustrate flow path of RF current therein. A substrate 206 is being processed within processing chamber 200. To ignite the plasma for etching substrate 206, a process gas in the chamber 200 is subjected to RF power. RF current may flow from an RF supply 222 along a cable 224 through an RF match network 220 into processing chamber 200 during substrate processing. The RF current may travel along a path 240 to couple with the process gas to create plasma within a confined chamber volume 210 for processing substrate 206, which is positioned above a bottom electrode 204.

In order to control plasma formation and to protect the processing chamber walls, a confinement ring 212 may be employed. Details of an exemplary confinement ring are described in commonly owned U.S. Provisional Patent Application Ser. Nos. 61/238,656, 61/238,665, 61/238,670, all filed on Aug. 31, 2009, and U.S. Patent Application Publication No. 2008/0149596, the disclosures of which are hereby incorporated by reference. The confinement ring 212 may be made of a conductive material such as silicon, polysilicon, silicon carbide, boron carbide, ceramic, aluminum, and the like. Usually, the confinement ring 212 may be configured to surround the periphery of confined chamber volume 210 in which a plasma is to form. In addition to the confinement ring 212, the periphery of confined chamber volume 210 may also be defined by upper electrode 202, bottom electrode 204, one or more insulator rings such as 216 and 218, an edge ring 214 and a lower electrode support structure 228.

In order to exhaust neutral gas species from the confinement region (confined chamber volume 210), the confinement rings 212 may include a plurality of slots (such as slots 226a, 226b, and 226c). The neutral gas species may be pumped out of processing chamber 200 via a turbo pump 234.

SUMMARY

Described herein is a confinement ring useful as a component of a capacitively-coupled plasma processing chamber wherein inner surfaces of the confinement ring provide an extended plasma confinement zone surrounding a gap between an upper electrode and a lower electrode on which a semiconductor substrate is supported during plasma processing in the chamber, the confinement ring comprising: an upper annular wall which extends horizontally and includes an annular flange at an inner end thereof adapted to underlie an outer edge of the upper electrode of the plasma chamber; a sidewall extending vertically downward from an outer end of the upper wall; and a lower annular wall extending horizontally inward from a lower end of the sidewall, the lower wall including circumferentially spaced apart radially extending slots, each of the slots having a length of at least 1.0 inch and a uniform width of 0.05 to 0.2 inch, the slots being evenly spaced at radial positions offset by no more than 2°.

DETAILED DESCRIPTION

Figure 3:
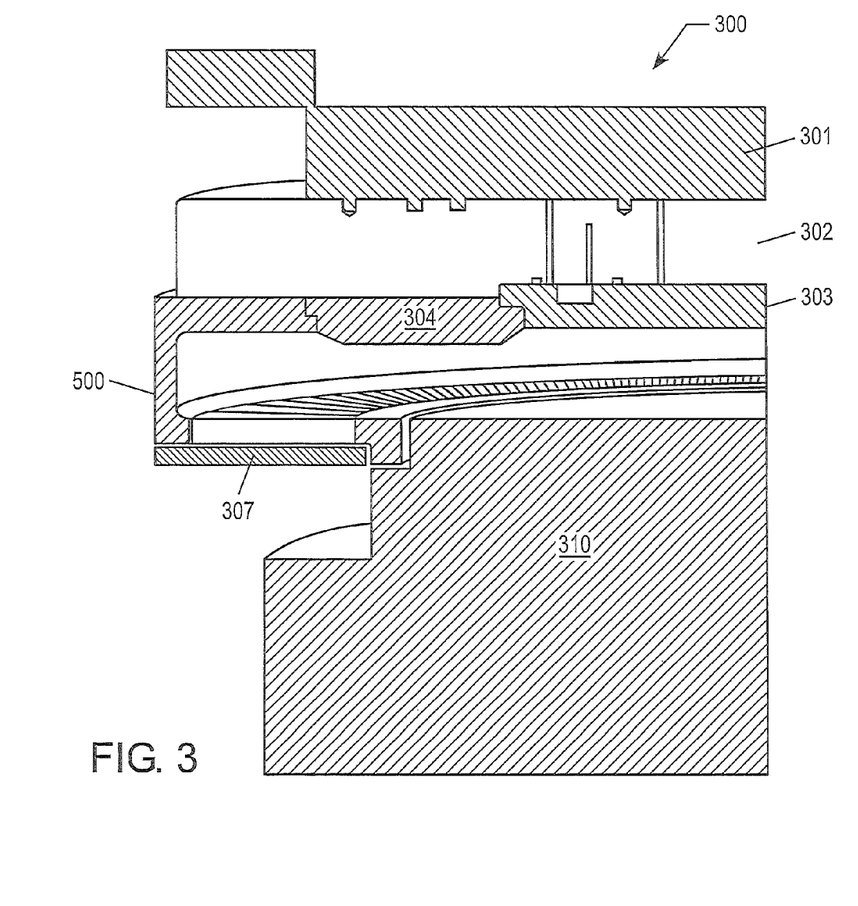
FIG. 3 shows a partial cross section of an exemplary adjustable gap capacitively-coupled plasma processing chamber.

Described herein is a confinement ring configured to confine plasma in an extended plasma confinement zone surrounding a gap between an upper electrode and a lower electrode of an adjustable gap capacitively-coupled plasma processing chamber. FIG. 3 shows a partial cross section of an exemplary adjustable gap capacitively-coupled plasma processing chamber 300. The chamber 300 comprises a substrate support assembly 310, an upper electrode including a center electrode plate 303 and an annular outer electrode 304 and an electrically conductive (e.g. pure aluminum or aluminum alloy collectively referred to herein as aluminum) confinement ring 500, according to an embodiment, extending outwardly from the annular outer electrode 304. The confinement ring 500 is C-shaped in cross section when viewed in a vertical plane passing through a center axis thereof.

FIGS. 4A-4F show details of the confinement ring 500. The confinement ring 500 comprises an upper annular wall 510 which extends horizontally and includes an annular flange 511 at an inner end thereof adapted to underlie an outer edge of the annular outer electrode 304 of the plasma processing chamber 300, a sidewall 520 extending vertically downward from an outer end of the upper wall 510, a lower annular wall 530 extending horizontally inward from a lower end of the sidewall 520, the lower wall 530 including circumferentially spaced apart radially extending slots 531 through which gaseous byproducts can be pumped out of the plasma confinement zone, each of the slots 531 having a length of at least 1.0 inch and a uniform width of 0.05 to 0.2 inch, the slots 531 being evenly spaced at radial positions offset by up to 2°, preferably offset by 1.25°.

Figure 4A:
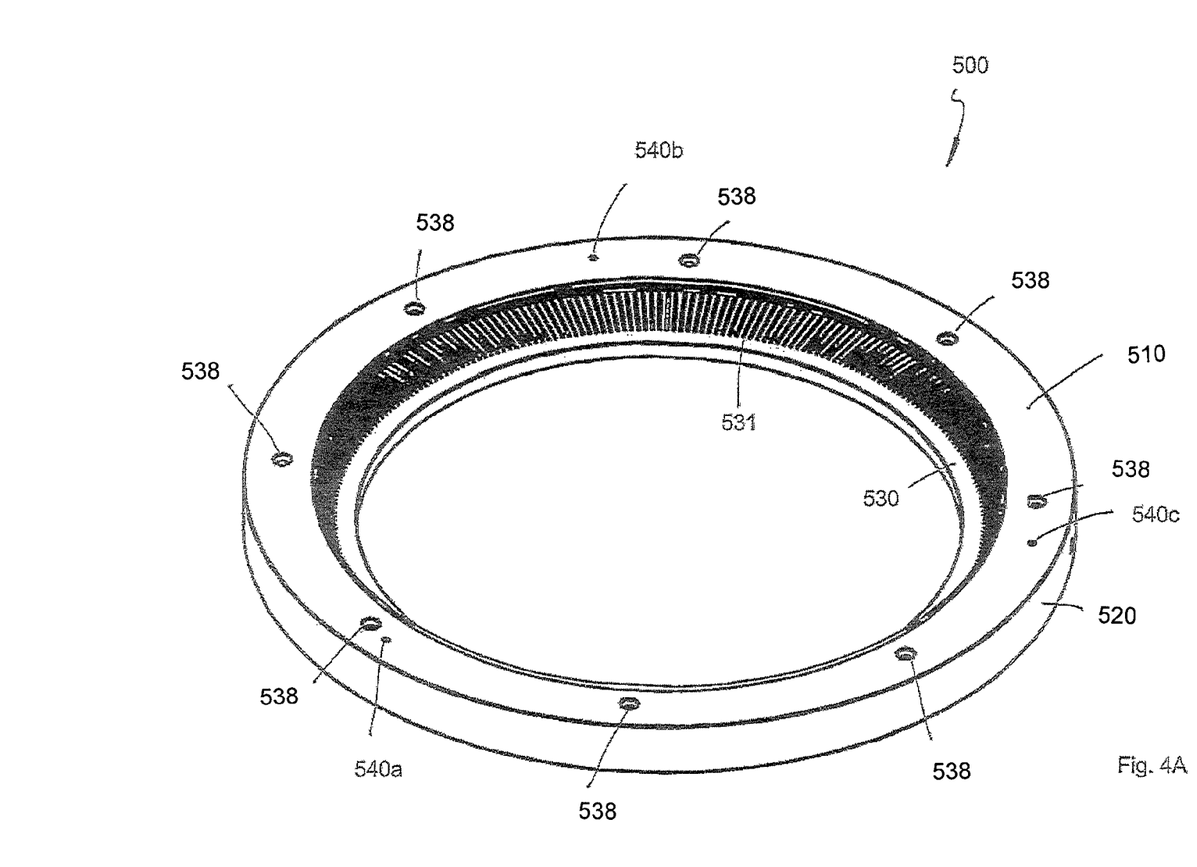
FIG. 4A is a perspective view of a confinement ring, according to an embodiment.
Figure 4B:
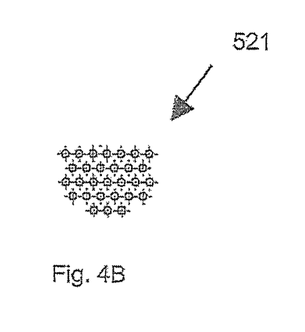
FIG. 4B shows details of a group of through holes in a sidewall of the confinement ring of FIG. 4A.

The sidewall 520 preferably is free of openings except for a group of evenly spaced through holes 521 arranged close together in 5 horizontal rows. Each hole 521 preferably has a diameter of about 0.030 inch ("about" as used herein means ±10%) and the holes 521 are spaced about 0.06 inch apart.

The lower wall 530 has an inner diameter of about 14.880 inches. The upper wall 510 has an inner diameter of about 16.792 inches. The sidewall 520 has an outer diameter of about 20.500 inches, an inner diameter of about 20.000 inches and a thickness of about 0.25 inch.

A lower horizontal surface 512 of the upper wall 510 is spaced from an upper horizontal surface 532 of the lower wall 530 by about 0.850 inch.

The lower wall 530 has a thickness of about 0.25 inch. The lower wall 530 includes a downwardly extending annular projection 535 at an inner perimeter thereof. The annular projection 535 has a width of about 0.365 inch and extends 0.2 inch below a lower surface 534 of the lower wall 530.

Each of the slots 531 has a length of about 1.892 inch and a width of about 0.08 inch. Ends of the slots 531 are rounded. Each of the slots 531 is offset by about 1.25° from its immediate neighbor. Each of the slots 531 extends radially from about 7.97 inches to about 9.862 inches from a center axis of the confinement ring 500.

The upper wall 510 has a thickness of about 0.31 inch. The annular flange 511 is formed by an annular recess 515 at an upper inner end of the upper wall 510. The annular recess 515 is formed by a horizontal surface 515b extending about 0.1245 inch from an inner perimeter of the upper wall 510 and a vertical surface 515a extending 0.165 inch from an upper surface 516 of the upper wall 510.

Figure 4C:
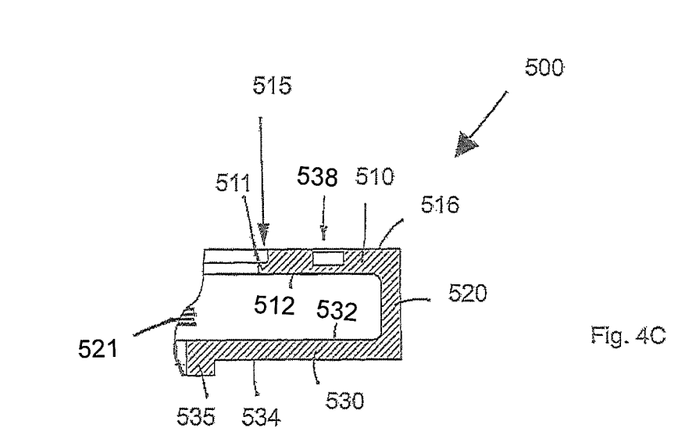
FIG. 4C shows a partial cross section through a threaded hole of the confinement ring of FIG. 4A.

The upper wall 510 includes eight 7/16-28 (the Unified Thread Standard) threaded holes 538 in the upper surface 516 thereof. Centers of the threaded holes 538 are located about 9.315 inches from the center axis of the confinement ring 500, offset 45° from each other. Each threaded hole 538 has a depth of about 0.2 inch.

Figure 4D:
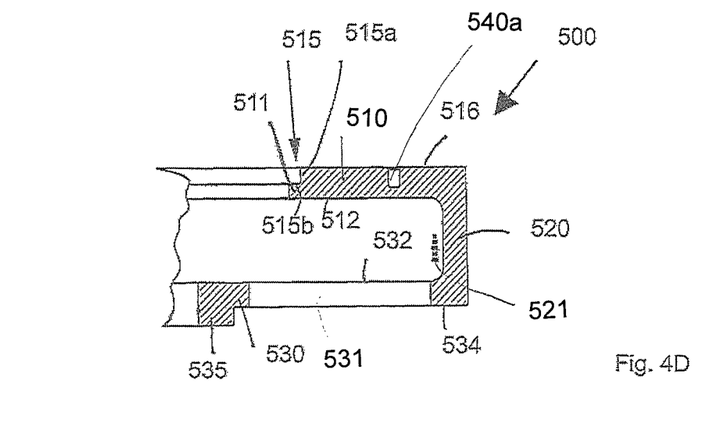
FIG. 4D shows a partial cross section through an alignment pin hole of the confinement ring of FIG. 4A.
Figure 4E:
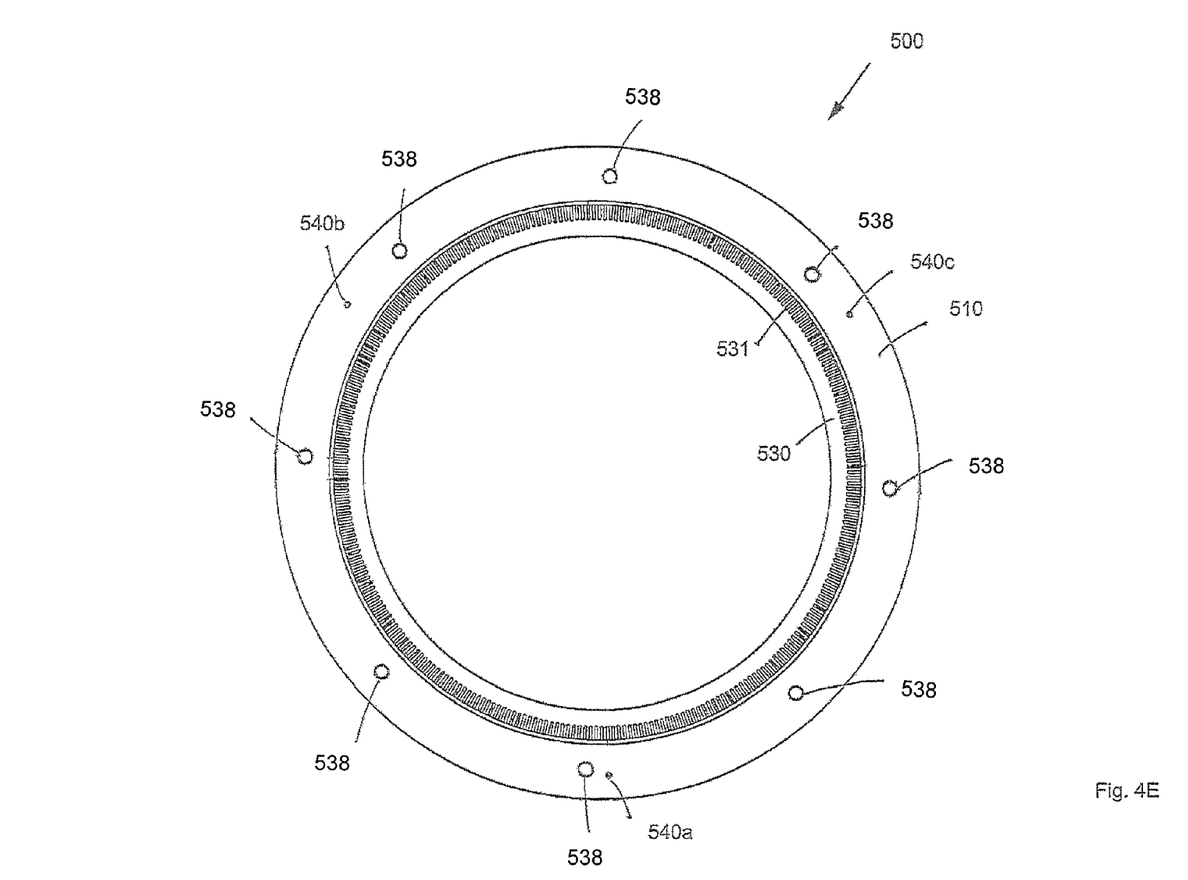
FIG. 4E is a top view of the confinement ring of FIG. 4A.
Figure 4F:
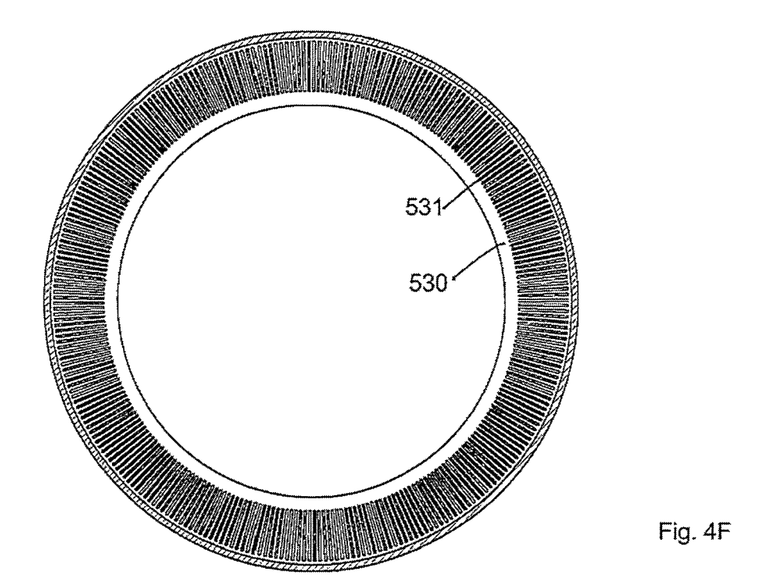
FIG. 4F is cut-away view of the confinement ring of FIG. 4A wherein a top wall thereof is removed.

The upper wall 510 further includes three alignment pin holes 540a, 540b and 540c (collectively referred to as 540). The alignment pin holes 540 are smooth (unthreaded). Each of the alignment pin holes has a diameter of about 0.116 inch and a depth of about 0.2 inch. Centers of the alignment pin holes 540 are located about 9.5 inches from the center axis of the confinement ring 500. Viewed in a direction from the upper wall 510 toward the lower wall 530, the hole 540c is offset counterclockwise by about 34.5° from one of the threaded holes 538; the hole 540b is offset counterclockwise by about 115° from the hole 540c; and the hole 540a is offset counterclockwise by about 125° from the hole 540b.

The confinement ring 500 can be a single monolithic part or an assembly of parts. For instance, the confinement ring 500 alternatively can comprise two or more sections mechanically attached (e.g. with a suitable bolt or clamp arrangement) or bonded (e.g. brazed, welded, or adhered), wherein the sections can be attached or bonded along horizontal or vertical surfaces.

The lower surface 534 can provide electrical contact with an upper end of a movable ground ring (not shown) of the substrate support assembly 310, wherein the lower surface 534 preferably includes an electrically conductive coating adapted to enhance electrical contact with the movable ground ring. Process gas and reaction byproducts can be pumped out of the plasma processing chamber through the radially extending slots 531.

Optionally, at least one slotted ring 307 can fit below the confinement ring 500. The slotted ring 307 can have a pattern of slots which can be positioned with respect to the confinement ring 500 to adjust gas flow conductance through the radially extending slots 531.

The confinement ring 500 is useful as a component of a capacitively-coupled plasma processing chamber wherein inner surfaces of the confinement ring 500 provide an extended plasma confinement zone surrounding a gap between an upper electrode and a lower electrode on which a semiconductor substrate is supported during plasma processing in the chamber.

While the confinement ring has been described in detail with reference to specific embodiments thereof, it will be apparent to those skilled in the art that various changes and modifications can be made, and equivalents employed, without departing from the scope of the appended claims.

We claim:

1. A confinement ring useful as a component of a capacitively-coupled plasma processing chamber wherein inner surfaces of the confinement ring provide an extended plasma confinement zone surrounding a gap between an upper electrode and a lower electrode on which a semiconductor substrate is supported during plasma processing in the chamber, the confinement ring comprising:

an upper annular wall which extends horizontally and includes an annular flange at an inner end thereof adapted to underlie an outer edge of the upper electrode of the plasma chamber;

a sidewall extending vertically downward from an outer end of the upper wall wherein the sidewall is free of openings except for a group of through holes arranged in 5 horizontal rows of evenly spaced holes having diameters of about 0.030 inch; and     a lower annular wall extending horizontally inward from a lower end of the sidewall, the lower wall including circumferentially spaced apart radially extending slots, each of the slots having a length of at least 1.0 inch and a uniform width of 0.05 to 0.2 inch, the slots being evenly spaced at radial positions offset by no more than 2°;

wherein the lower wall includes a downwardly extending annular projection at an inner perimeter thereof, the projection having a lower surface and the lower surface includes an electrically conductive coating.

2. The confinement ring of claim 1, wherein the lower wall has an inner diameter of about 14.880 inches and a thickness of about 0.25 inch.

3. The confinement ring of claim 1, wherein the upper wall has an inner diameter of about 16.792 inches and a thickness of about 0.31 inch.

4. The confinement ring of claim 1, wherein the sidewall has an outer diameter of about 20.500 inches, an inner diameter of about 20.000 inches, and a thickness of about 0.25 inch.

5. The confinement ring of claim 1, wherein a lower horizontal surface of the upper wall is spaced from an upper horizontal surface of the lower wall by about 0.850 inch.

6. The confinement ring of claim 1, wherein each of the slots has a length of about 1.892 inch and a width of about 0.08 inch, ends of the slots being rounded and each of the slots offset by 1.25° from its immediate neighbor, and each of the slots extends radially from about 7.97 inches to about 9.862 inches from a center axis of the confinement ring.

7. The confinement ring of claim 1, wherein the downwardly extending annular projection has a width of about 0.365 inch and extending about 0.2 inch below a lower surface of the lower wall.

8. The confinement ring of claim 1, wherein the annular flange is formed by an annular recess at an upper inner end of the upper wall, the annular recess formed by a horizontal surface extending about 0.1245 inch from an inner perimeter of the upper wall and a vertical surface extending about 0.165 inch from an upper surface of the upper wall.

9. The confinement ring of claim 1, further comprising eight 7/16-28 threaded holes extending only part way in an upper surface of the upper wall, wherein centers of the threaded holes are located about 9.315 inches from a center axis of the confinement ring and offset 45° from each other; and each of the threaded holes has a depth of about 0.2 inch.

10. The confinement ring of claim 9, further comprising first, second and third alignment pin holes, wherein:

the alignment pin holes are unthreaded;

each of the alignment pin holes has a diameter of about 0.116 inch and a depth of about 0.2 inch;

centers of the alignment pin holes are located about 9.5 inches from a center axis of the confinement ring;

the third alignment pin hole is offset counterclockwise by about 34.5° from one of the threaded holes;

the second alignment pin hole is offset counterclockwise by about 115° from the third alignment pin hole;
the first alignment pin hole is offset counterclockwise by about 125° from the second alignment pin hole.

11. The confinement ring of claim 1, wherein the confinement ring is a single monolithic part or comprises two or more sections mechanically attached or bonded along horizontal or vertical surfaces.

12. The confinement ring of claim 1, wherein the confinement ring is made of an electrically conductive material.

13. The confinement ring of claim 1, wherein the confinement ring is made of aluminum.

14. The confinement ring of claim 1, wherein the slots have a uniform width vertically between upper and lower surfaces of the lower annular wall.

15. The confinement ring of claim 1, wherein inner and outer ends of the slots are rounded.

* * * * *